US006943759B2

(12) United States Patent
Tam

(10) Patent No.: US 6,943,759 B2
(45) Date of Patent: Sep. 13, 2005

(54) CIRCUIT, DRIVER CIRCUIT, ORGANIC ELECTROLUMINESCENT DISPLAY DEVICE ELECTRO-OPTICAL DEVICE, ELECTRONIC APPARATUS, METHOD OF CONTROLLING THE CURRENT SUPPLY TO AN ORGANIC ELECTROLUMINESCENT PIXEL, AND METHOD FOR DRIVING A CIRCUIT

(75) Inventor: Simon Tam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 388 days.

(21) Appl. No.: 09/899,915

(22) Filed: Jul. 9, 2001

(65) Prior Publication Data

US 2002/0033718 A1 Mar. 21, 2002

(30) Foreign Application Priority Data

Jul. 7, 2000 (GB) .............................................. 0016816

(51) Int. Cl.⁷ ................................................ G09G 3/30
(52) U.S. Cl. .......................... 345/76; 345/82; 315/169.3
(58) Field of Search ............................ 345/76–82, 204; 315/169.1–169.4

(56) References Cited

U.S. PATENT DOCUMENTS

| | | | |
|---|---|---|---|
| 5,519,288 A | 5/1996 | Tatsumi et al. | |
| 5,684,368 A | 11/1997 | Wei et al. | |
| 5,714,968 A | 2/1998 | Ikeda | |
| 5,903,246 A | 5/1999 | Dingwall | |
| 5,952,789 A | 9/1999 | Stewart et al. | |
| 6,091,203 A | 7/2000 | Kawashima et al. | |
| 6,229,506 B1 | 5/2001 | Dawson et al. | |
| 6,351,078 B1 | 2/2002 | Wang et al. | |
| 6,356,029 B1 * | 3/2002 | Hunter ..................... | 315/169.1 |
| 6,373,454 B1 * | 4/2002 | Knapp et al. ................. | 345/76 |
| 6,498,438 B1 * | 12/2002 | Edwards .................... | 315/169.3 |
| 6,501,449 B1 | 12/2002 | Huang | |
| 6,501,466 B1 | 12/2002 | Yamagishi et al. | |
| 6,535,185 B2 * | 3/2003 | Kim et al. ..................... | 345/76 |
| 6,580,408 B1 * | 6/2003 | Bae et al. ..................... | 345/76 |

FOREIGN PATENT DOCUMENTS

| | | |
|---|---|---|
| EP | 0 365 445 A2 | 4/1990 |
| EP | 0 895 219 A1 | 2/1999 |
| EP | 0 917 127 A1 | 5/1999 |
| GB | 2 337 354 A | 11/1999 |
| JP | A-11-282419 | 10/1999 |
| WO | WO 99/65011 | 12/1999 |
| WO | WO 99/65012 | 12/1999 |

OTHER PUBLICATIONS

Dawson, R.M.A., et al., "The Impact of the Transient Response of Organic Light Emitting Diodes on the Design of Active Matrix OLED Displays", *IEEE*, 1998, IEDM 98, pp. 895–878.

* cited by examiner

*Primary Examiner*—Regina Liang
(74) *Attorney, Agent, or Firm*—Oliff & Berridge, PLC

(57) ABSTRACT

A driver circuit operating in stages that comprise a programming stage and a reproduction stage, the circuit comprising: a plurality current paths each of which passes through the circuit, a current driven element, a transistor connected so as operatively to control the current supplied to the said element, a capacitor connected for storing an operating voltage of the transistor during the programming stage, and switching means which control the current paths, the arrangement being such that one of the current paths does not include the said element. No current is applied to the current driven element by the current controlling transistor during the programming stage and thus the overall power consumption is reduced. Furthermore, the circuit can be operated from a normal supply voltage rather than requiring a high bias voltage. During the programming stage, the circuit uses a current sink rather than a current source. Preferably, the current driven element is an electroluminescent element.

22 Claims, 8 Drawing Sheets

Figure 6
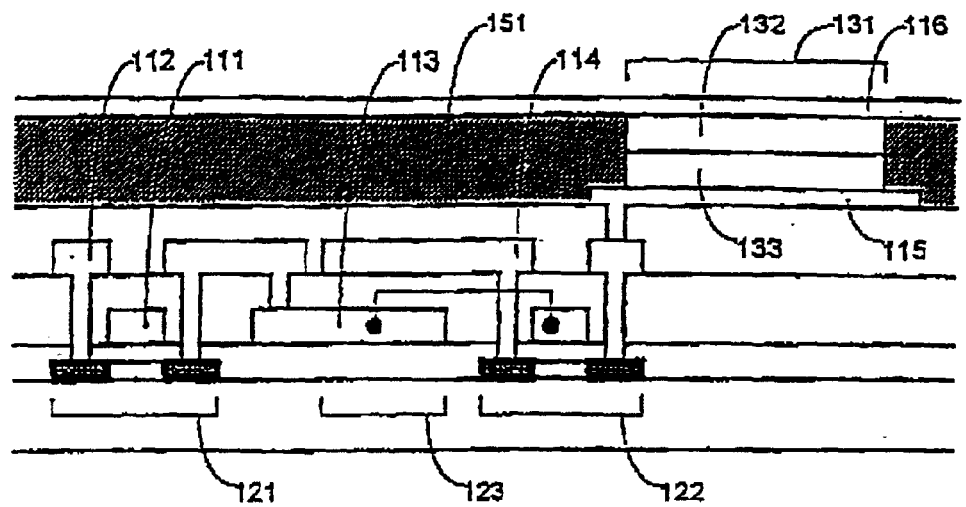
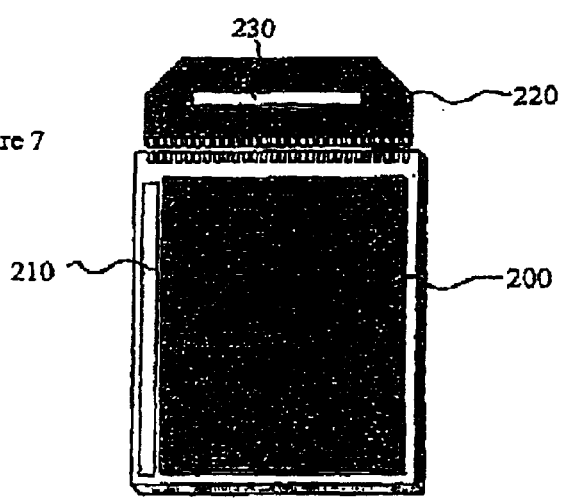
Figure 7
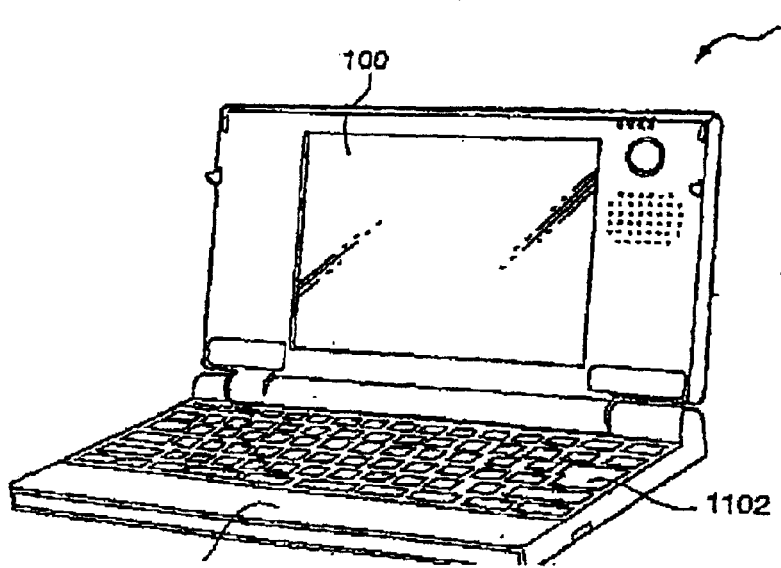
Figure 10

US 6,943,759 B2

CIRCUIT, DRIVER CIRCUIT, ORGANIC ELECTROLUMINESCENT DISPLAY DEVICE ELECTRO-OPTICAL DEVICE, ELECTRONIC APPARATUS, METHOD OF CONTROLLING THE CURRENT SUPPLY TO AN ORGANIC ELECTROLUMINESCENT PIXEL, AND METHOD FOR DRIVING A CIRCUIT

BACKGROUND OF INVENTION

1. Field of Invention

The present invention relates, inter alia, to a driver circuit. One particular application of such a driver circuit is for driving a pixel of an organic electroluminescent device.

2. Desription of Related Art

An organic electro-luminescent (OEL) element comprises a light emitting material layer sandwiched between an anode layer and a cathode layer. Electrically, this element operates like a diode. Optically, it emits light when forward biased and the intensity of the emission increases with the forward bias current. It is possible to construct a display panel with a matrix of OEL elements fabricated on a transparent substrate and with at least one of the electrode layers being transparent. One can also integrate the driving circuit on the same panel by using low temperature polysilicon thin film transistor (TFT) technology.

In a basic analog driving scheme for an active matrix OEL display, a minimum of two transistors are required per pixel (FIG. 1): $T_1$ is for addressing the pixel and $T_2$ is for converting the data voltage signal into current which drives the OEL element at a designated brightness. The data signal is stored by the storage capacitor $C_{storage}$ when the pixel is not addressed Although p-channel TFTs are shown in the figures, the same principle can also be applied for a circuit with n-channel TFTs.

There are problems associated with TFT analog circuits and OEL elements do not act like perfect diodes. The light emitting material does, however, have relatively uniform characteristics. Due to the nature of the TFT fabrication technique, spatial variation of the TFT characteristics exists over the entire panel. One of the most important considerations in a TFT analog circuit is the variation of threshold voltage, $\Delta V_T$, from device to device. The effect of such variation in an OEL display, exacerbated by the non perfect diode behaviour, is the non-uniform pixel brightness over the display panel, which seriously effects the image quality. Therefore, a built-in circuit for compensating a dispersion of transistor characteristics is required.

A circuit shown in FIG. 2 is proposed as one of built-in for compensating a variation of transistor characteristics. In this circuit $T_1$ is for addressing the pixel. $T_2$ operates as an analog current control to provide the driving current $T_3$ connects between the drain and gate of $T_2$ and toggles $T_2$ to be either a diode or in saturation. $T_4$ acts as a switch. Either $T_1$ or $T_4$ can be ON at any one time. Initially, $T_1$ and $T_3$ are OFF, and $T_4$ is ON. When $T_4$ is OFF, $T_1$ and $T_3$ are ON, and a curt of known value is allowed to flow into the OEL element, through $T_2$. This is the programming stage because the threshold voltage of $T_2$ is measured with $T_2$ operating as a diode (with $T_3$ turned ON) while the programming current is allowed to flow through $T_1$, through $T_2$ and into the OEL element. $T_3$ shorts the drain and gate of $T_2$ and turns $T_2$ in to a diode. The detected threshold voltage of $T_2$ is stored by the capacitor $C_1$ connected between the gate and source terminals of $T_2$ when $T_3$ and $T_1$ are switched OFF. Then $T_4$ is turned ON, the current is now provided by $V_{DD}$. If the slope of the output characteristics were flat, the reproduced current would be the same as the programed current for any threshold voltage of $T_2$ detected. By turning ON $T_4$, the drain-source voltage of $T_2$ is pulled up, so a flat output characteristic will keep the reproduced current the same as the programmed current. Note that $\Delta V_{T2}$ shown in FIG. 2 is imaginary, not real.

A constant current is provided, in theory, during the active programming stage, which is $t_2$ to $t_5$ in the timing diagram shown in FIG. 2. The reproduction stage starts at $t_6$.

The circuit of FIG. 2 is advantageous but there is an on-going desire to reduce power consumption. In particular, implementation of the current-source in the circuit of FIG. 2 requires a bias voltage ($V_{BIAS}$) in addition to the supply voltage ($V_{DD}$). Although the supply voltage ($V_{DD}$) could be increased to cover the required bias voltage ($V_{BIAS}$)—which would have the advantage of reducing the component count, there is still an overall increase in system power consumption to program with any value of data current ($I_{DAT}$).

Attention is, by the present invention, drawn to the fact that all currents passing through the circuit of FIG. 2 pass through the OEL element. The significance of this to the present invention will be apparent from the description given hereinafter.

SUMMARY OF THE INVENTION

According to a first aspect of the present invention there is provided a driver circuit operating in stages that comprise a programming stage and a reproduction stage, the circuit comprising: a plurality of current paths each of which passes through the circuit, a current driven element, a transistor connected so as operatively to control the current supplied to the said element, a capacitor connected for storing an operating voltage of the transistor during the programming stage, and switching means which control the current paths, the arrangement being such that one of the current paths does not include the said element.

According to a second aspect of the present invention there is provided a driver circuit for driving a pixel of an electroluminescent device, the pixel including an electroluminescent element and the circuit comprising; a transistor connected so as operatively to control the current supplied to the electroluminescent element, a capacitor connected for storing an operating voltage of the transistor during a programming stage, a first switching means connected so as to establish when operative a current path through the transistor during the programming stage, and a second switching means connected so as to establish when operative a current path through the transistor and the electroluminescent element during a reproduction stage, wherein the first switching means is connected such that the current path during the programming stage does not pass through the electroluminescent element.

According to a third aspect of the present invention there is provided a driver circuit for driving a pixel of an electroluminescent device, the pixel including an electroluminescent element and the circuit comprising; a transistor connected so as operatively to control the current supplied to the electroluminescent element, a capacitor connected for storing an operating voltage of the transistor dug a programming stage, a first switching means connected so as to establish when operative a current path through the transistor during the programming stage, a second switching means connected so as to establish when operative a current path through the transistor and the electroluminescent element during a reproduction stage, and a current sink, the first switching means being connected such that the current path during the programming stage is through the transistor to the current sink.

According to a fourth aspect of the present invention there is provided a method of controlling the current supply to an electroluminescent element comprising the steps of providing a current path during a programming stage which path does not pass through the electroluminescent element and of providing a current path during a reproduction stage which path does pass through the electroluminescent element.

According to a fifth aspect of the present invention there is provided a method of controlling the current supply to an electroluminescent element comprising the steps of providing a current path during a programming stage which path connects to a current sink and of providing a current path during a reproduction stage which path passes through the electroluminescent element.

According to a sixth aspect of the present invention there is provided an electroluminescent display device comprising one or more driver circuits according to any of the first to third aspects of the present invention.

According to a seventh aspect of the present invention there is provided an electronic apparatus incorporating an electroluminescent display device according to the sixth aspect of the present invention.

According to an eight aspect of the present invention there is provided a circuit comprising a current driven element the circuit providing a first current path including the current driven element and a second current path not including the current driven element.

According to a ninth aspect of the present invention there is provided a circuit comprising a current driven element, the circuit providing a first current path flowing a current through the current driven element, and a second current path not flowing current through the current driven element.

According to a tenth aspect of the present invention there is provided a method for driving a circuit comprising a current driven element and a transistor that controls a current supplied to the current driven element, comprising a step of determining a gate voltage of the transistor based on a predetermined current.

It will be noted that according to the present invention no current is applied to the current driven element by the current controlling transistor during the programming stage. In accordance with the invention in an electroluminescent device a pixel driver circuit can be implemented without degrading the perceived image presented by the electroluminescent device. It has the benefit of reducing the overall power consumption compared with the prior art in which the same current is supplied to the OEL element during both the programming and the reproduction stage. Furthermore, the circuit can be operated from a normal supply voltage rather than requiring a high bias voltage as in the prior art. In effect, the present invention provides for separation of the programming and the reproduction current paths. This enables a number of advantages to be achieved. For example, if there is no current flow through the OEL element during the programming stage then the programming stage operates more quickly—since the arrangement avoids the slow down caused by the parasitic capacitance of the OEL element.

BRIEF DESRIPTION OF THE DRAWINGS

Embodiments of the present invention will now be described by way of further example only and with reference to the accompanying drawings, in which:

FIG. 1 shows a conventional OEL element pixel driver circuit using two transistors, FIG. 2 shows a known current programmed OEL element driver with threshold voltage compensation, FIG. 3 shows a pixel driver circuit according to a first embodiment of the present invention, FIG. 4 shows a pixel driver circuit according to a second embodiment of the present invention, FIG. 5 shows several pixels in a matrix display wherein each pixel uses the circuit of FIG. 4, FIG. 6 is a schematic sectional view of a physical implementation of an OEL element and pixel driver according to an embodiment of the present invention, FIG. 7 is a simplified plan view of an OEL display panel incorporating the present invention, FIG. 8 shows another embodiment of a pixel driver circuit according to the present invention, FIG. 9 shows another embodiment of a pixel driver circuit according to the present invention, FIG. 10 is a schematic view of a mobile personal computer incorporating a display device having a pixel driver according to the present invention, FIG. 11 is a schematic view of a mobile telephone incorporating a display device having a pixel driver according to the present invention, FIG. 12 is a schematic view of a digital camera incorporating a display device having a pixel driver according to the present invention, FIG. 13 illustrates the application of the driver circuit of the present invention to a magnetic RAM, FIG. 14 illustrates the application of the driver circuit of the present invention to a magnetoresistive element, FIG. 15 illustrates the application of the driver circuit of the present invention to a capacitance sensor or a charge sensor, FIG. 16 illustrates the application of the driver circuit of the present invention to a night vision camera, and FIG. 17 is a brief outline of an alternative implementation of the circuit of FIG. 4.

DETAILED DESCRIPTION OF PREFERRED EMBODIMENTS

A pixel driver circuit according to a first embodiment of the present invention is shown in FIG. 3. Transistor $T_2$ operates as an analog current control to provide the driving current to the OEL element. Also, the storage capacitor $C_1$ is connected between the gate and the source of transistor $T_2$. In the circuit of FIG. 2, a current source is operatively connected to the source of transistor $T_2$ by transistor $T_1$, during the programming stage, and current is thus applied to the OEL element. In the embodiment of the present invention, transistor $T_1$ operatively connects transistor $T_2$ to a current sink during the programming stage. That is, according to the present invention, during the programming stage no current is supplied through transistor $T_2$ to the OEL element. In the circuit of FIG. 3, the drain of transistor $T_2$ is connected to the source of transistor $T_1$ via the source/drain path of transistor $T_3$. The source of transistor $T_1$ is connected to the gate of transistor $T_2$ and the gates of transistors and $T_3$ are connected together. The programming voltage $V_P$ is applied to the gates of $T_1$ and $T_3$. Transistor $T_4$, which is switched off during the programming stage, connects the drain of $T_2$ and the source of $T_3$ to the OEL element. During the programming stage, transistor $T_1$ operatively connects transistor $T_2$ to a current sink which is tied to ground or a reference voltage.

The circuit of FIG. 3 operates in the programming stage with $T_4$ switched off and $T_1$ and $T_3$ switched on. $T_3$ being switched on has the effect of making $T_2$ act as a diode and $T_1$ connects this diode to the data current sink. As a result, capacitor $C_1$ charges (or discharges, depending on the voltage stored during the previous frame). Capacitor $C_1$ charges to the gate/source voltage of transistor $T_2$ and thus stores the voltage ($V_{GS2}$, corresponding to the data current $I_{DAT}$) which will control the current supply to the OEL element during the reproduction stage. At the end of the programming stage, $T_1$ and $T_3$ are switched off. The voltage $V_{GS2}$ is stored on $C_1$ for the remainder of the frame period. As will be readily apparent from the circuit diagram and this description, in accordance with the present invention there is no requirement for a bias voltage to provide a current source. That is, the supply voltage ($V_{DD}$) in FIG. 3 is determined by $T_2$ and by the OEL element and there is no requirement for a high voltage to power a current source. The maximum voltage required by the circuit is thus significantly less than that required by the circuit of FIG. 2.

At the start of the programming stage, with $T_4$ switched off, it is found that the OEL element exhibits a parasitic capacitance which discharges through the device. The rate of charging of $C_1$ determines the time taken for the programming stage. In accordance with circuits embodying the present invention, the capacitance of $C_1$ can be relatively small and thus the charging can be very rapid. As a consequence, the period for which no current is applied to the OEL element by $T_2$ is very short compared with the whole Same. These factors, together with the persistence of vision of the human eye means that there is no perceptible degradation of a displayed image.

The off resistance of $T_3$ can be important, because aft $C_1$ has been charged and $T_3$ is switched off, the off resistance of $T_3$ can affect the voltage across $C_1$ for the rest of the frame period. Thus, the gate/source capacitance of $T_3$ should preferably be small compared with $C_1$.

The reproduction voltage $V_R$ is applied to the gate of transistor $T_4$. At the beginning of the reproduction stage, in the circuit of FIG. 3, $T_4$ is switched on and $T_1$ and $T_3$ switched off. As a result, $T_2$ acts as a current source with $V_{GS2}$ biased by $C_1$, thus supplying current to the OEL element. At the end of the reproduction stage $T_4$ is switched off, $T_1$ and $T_3$ remain switched off his completes one cycle. The driving waveform is indicated in FIG. 3.

FIG. 4 illustrates a second embodiment according to the present invention. The circuit of FIG. 4 differs from that of FIG. 3 in the connection of transistor $T_3$. In the circuit of FIG. 4. $T_1$ is connected to $C_1$ through the drain/source path of $T_3$. The circuit of FIG. 4 is preferred to that of FIG. 3 because $T_3$ is not in the current path during the programing stage. Otherwise the operation and effects of the second embodiment are similar to those of the first embodiment.

FIG. 5 is a circuit diagram showing a number of pixels in an active matrix display, with each pixel implemented in accordance with the circuit of FIG. 4. To simplify the illustration, a monochrome display device is shown. Since the circuit is of an active matrix, pixels on the same row are addressed at the same time. Transistor $T_3$ is responsible for pixel addressing, so its source terminal is connected to the current data line shared by a column of pixels. Because of this the leakage current of $T_3$ should be kept to a minimum. This can be ensured by using a multi-gate structure for $T_1$. In addition to a multi-gate structure, a lightly doped drain (LDD) structure can also reduce the leakage current.

FIG. 6 is a schematic cross-sectional view of the physical implementation of the pixel driver circuit in an OEL element structure. In FIG. 6, numeral 132 indicates a hole injection layer, numeral 133 indicates an organic EL layer, and numeral 151 indicates a resist or separating structure. The switching thin-film transistor 121 and the n-channel type current-thin-film transistor 122 adopt the structure and the process ordinarily used for a low-temperature polysilicon thin-film transistor, such as are used for example in known thin-film transistor liquid crystal display devices such as a top-gate structure and a fabrication process wherein the maximum temperature is 600° C. or less. However, other strut and processes are applicable.

The forward oriented organic EL display element 131 is formed by: the pixel electrode 115 formed of Al, the opposite electrode 116 formed of ITO, the hole injection layer 132, and the organic EL layer 133. In the forward oriented organic EL display element 131, the direction of current of the organic EL display device can be set from the opposite electrode 116 formed of ITO to the pixel electrode 115 formed of Al.

The hole injection layer 132 and the organic EL layer 133 may be formed using an ink-jet printing me employing the resist 151 as a separating structure between the pixels. The opposite electrode 116 formed of ITO may be formed using a sputtering method However, other methods may also be used for forming all of these components.

The typical layout of a full display panel employing the present invention is shown schematically in FIG. 7. The panel comprises an active matrix OEL element 200 with analogue current program pixels, an integrated TFT scanning driver 210 with level shifter, a flexible TAB tape 220, and an external analogue driver LSI 230 with an integrated RAM/controller. Of course, this is only one example of the possible panel arrangements in which the present invention can be used.

The structure of the organic EL display device is not limited to the one described here. Other structures are also applicable.

With reference for example to the circuit of FIG. 3, it will be appreciated that the invention provides a data current source in this case forte OEL element. The circuit is readily extended so as to provide an amplified and/or multiple level (current) output. The principle of such a circuit cam be understood with reference to FIG. 8. the circuit of FIG. 8 comprises the circuit of FIG. 3 with an additional drive transistor $T_5$ and an additional switching transistor $T_6$ added. The source of $T_5$ is connected to $V_{DD}$ and its gate receives the same drive voltage signal as is applied to the gate of transistor $T_2$. The drain of transistor $T_5$ is series connected to the drain of transistor $T_6$ and the source of $T_6$ is connected to the common point of connection of transistors $T_2$, $T_3$ and $T_4$. The gate of transistor $T_6$ is connected to the gate of transistor $T_4$. If it is assumed that the characteristic of transistor $T_2$ is W/L and that the characteristic of transistor $T_5$ is selected to be (N-1)W/L then a current amplification of:

$$I_{out} = I_{in} \times N$$

is achieved. $I_{in}$ is the current which flows through the current sink, i.e. $I_{DAT}$ in FIGS. 3 and 4. $I_{out}$ is the current which flows through the OEL element. Thus the circuit of FIG. 8 can be used to reduce the value of $I_{DAT}$ compared with the circuit of FIGS. 3 and 4, while maintaining the same current trough the OEL element. Lowering the value of $I_{DAT}$ has the advantage of enabling the operating speed of the circuit to be increased. Lowering the value of $I_{DAT}$ also has the advantage of lowering the transmission loss experienced across a matrix of pixels, which is particularly important with respect to large scale display panels.

Of course, additional stages—each adding their own circuit of additional transistors $T_5$ and $T_6$—can be added. With the switching transistors $T_6$ series connected and each receiving its own gate drive signal—as shown in FIG. 9 (A,B etc)—different current values can be selected to pass through the OEL element, resulting in different intensities of light output.

Preferably the circuits shown in FIGS. 3 to 9 are implemented using thin film transistor (TFT) technology, most preferably in polysilicon.

The present invention is particularly advantageous for use in small, mobile electronic products such as mobile phones, computers, CD players, DVD players and the like—although it is not limited thereto.

Several electronic apparatuses using the above organic electroluminescent display device will now be described.

<1: Mobile Computer>

An example in which the display device according to one of the above embodiments is applied to a mobile personal computer will now be described.

FIG. 10 is an isometric view illustrating the configuration of this personal computer, in the drawing, the personal computer 1100 is provided with a body 1104 including a keyboard 1102 and a display unit 1106. The display unit 1106 is implemented using a display panel fabricated according to the present invention, as described above.

<2: Portable Phone>

Next, an example in which the display device is applied to a display section of a portable phone will be described. FIG. 11 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display panel fabricated according to the present invention, as described above.

<3: Digital Still Camera>

Next, a digital still camera using an OEL display device as a finder will be described FIG. 12 is an isometric view illustrating the configuration of the digital still camera and the connection to external devices in brief.

Typical cameras sensitize films based on optical images from objects, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object A photo acceptance unit 1304 including optical lenses and the CCD is provided at the front side (behind in the drawing) of the case 1302.

When a cameraman determines the object image displayed in the OEL element panel 100 and releases the shutter, the image signal from the CCD are transmitted and stored to memories in a circuit board 1308, In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 10, the portable phone shown in FIG. 11, and the digital still camera shown in FIG. 12, include OEL element television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above OEL device can be applied to display sections of these electronic apparatuses.

The driver circuit of the present invention can be disposed not only in a pixel of a display unit but also in a driver disposed outside a display unit.

In the above, the driver circuit of the present invention has been described with reference to various display devices. The applications of the driver circuit of the present invention are much broader than just display devices and include, for example, its use with a magnetoresistive RAM, a capacitance sensor, a charge sensor, a DNA sensor, a night vision camera and many other devices.

In FIG. 13 a magnetic head is indicated by the reference MH.

In FIG. 14 a magnetic head is indicated by the reference MH. and a magnetic resistor is indicated by the reference MR.

Figure 15:
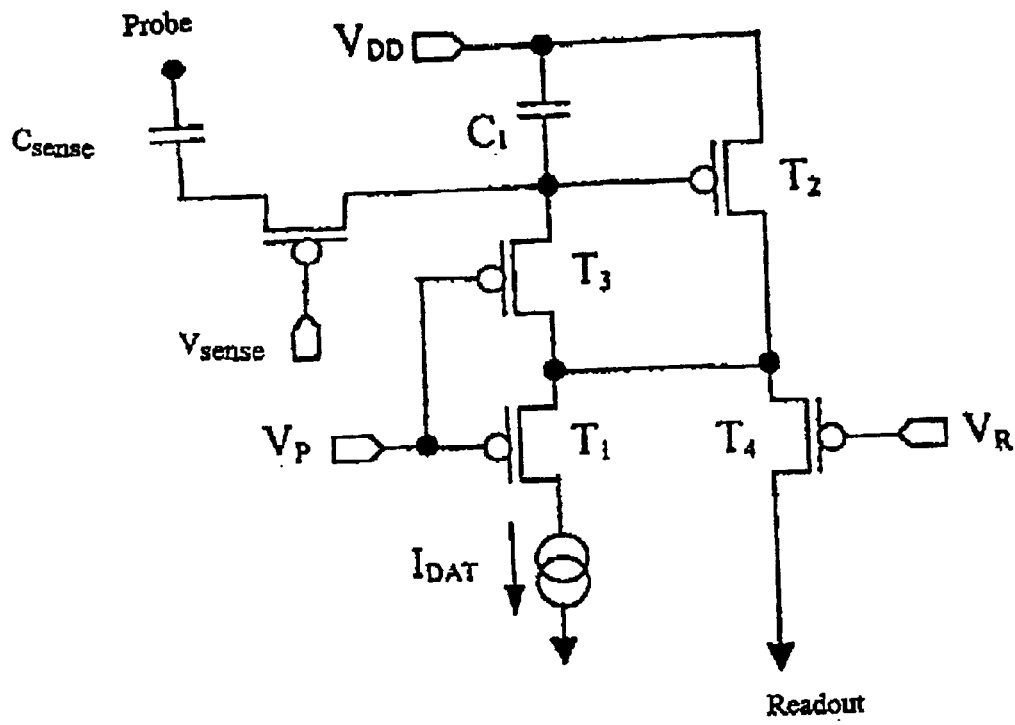

FIG. 15 illustrates the application of the driver circuit of the present invention to a capacitance sensor or a charge sensor. In FIG. 15 a sense capacitor is indicated by the reference $C_{sense}$. The circuit of FIG. 15 is also applicable to other applications, such as a fingerprint sensor and a DNA sensor.

Figure 16:
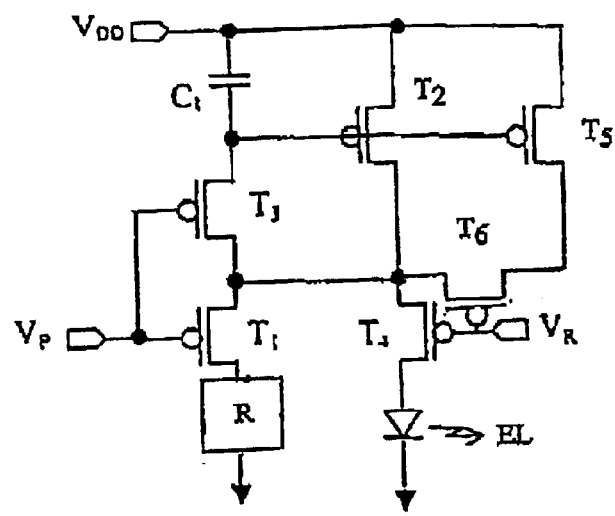

FIG. 16 illustrates the application of the driver circuit of the present invention to a night vision camera. In FIG. 16 a photoconductor is indicated by reference R.

Figure 1:
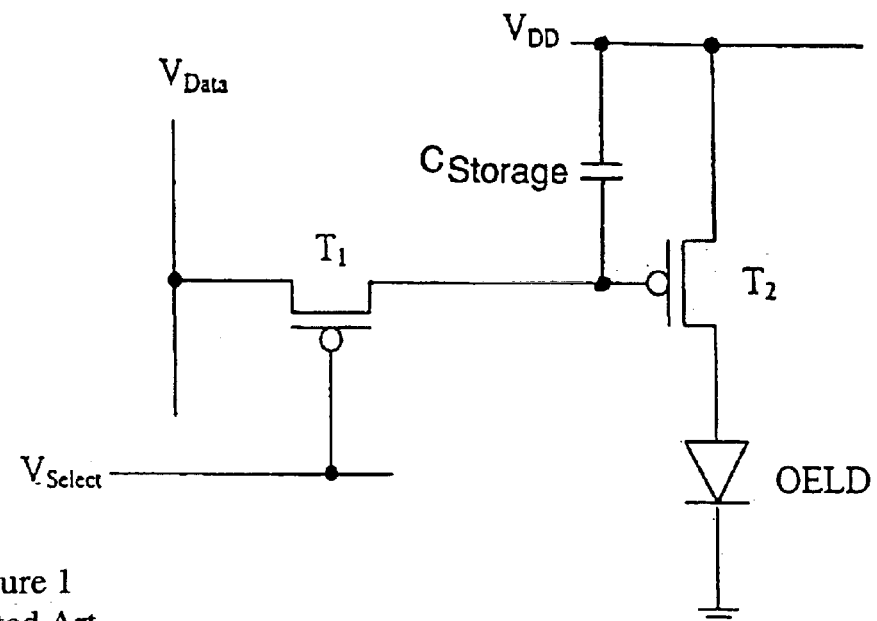
Figure 2:
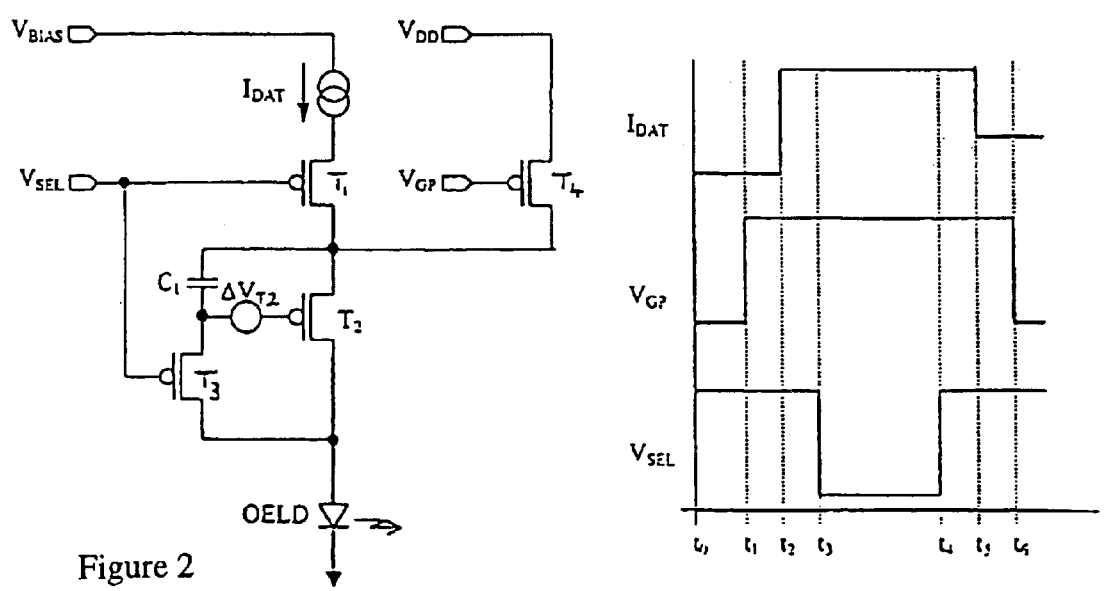
Figure 3:
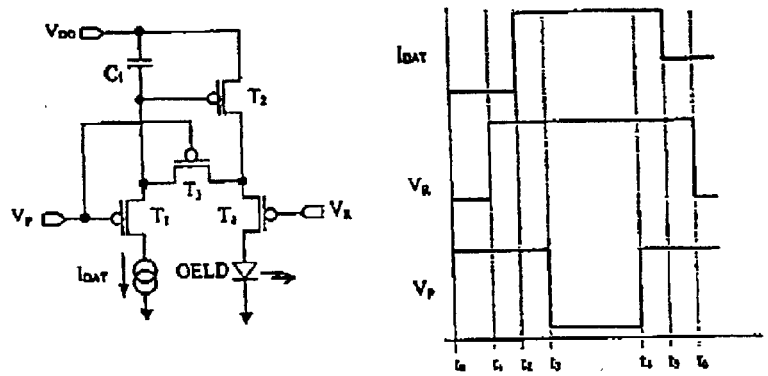
Figure 4:
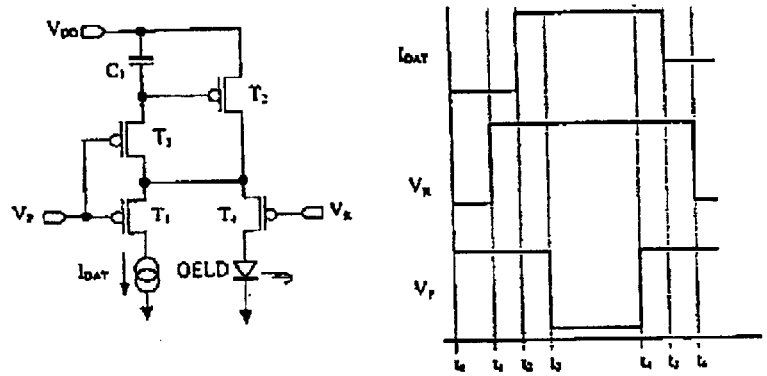
Figure 5:
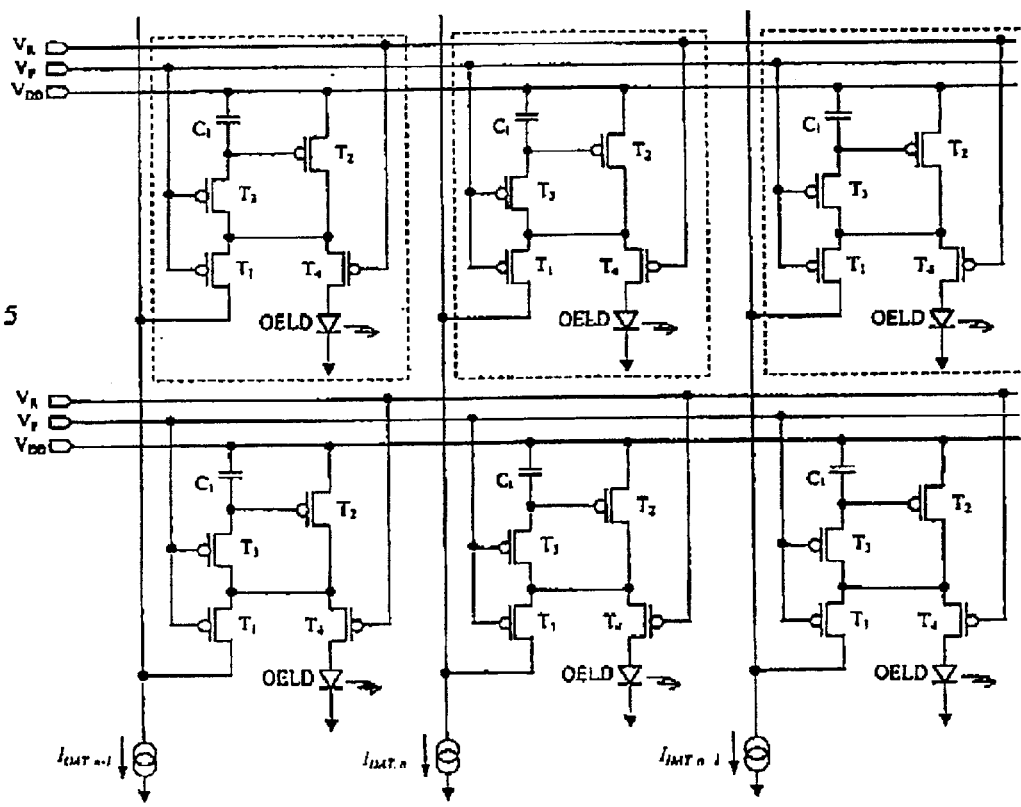
Figure 8:
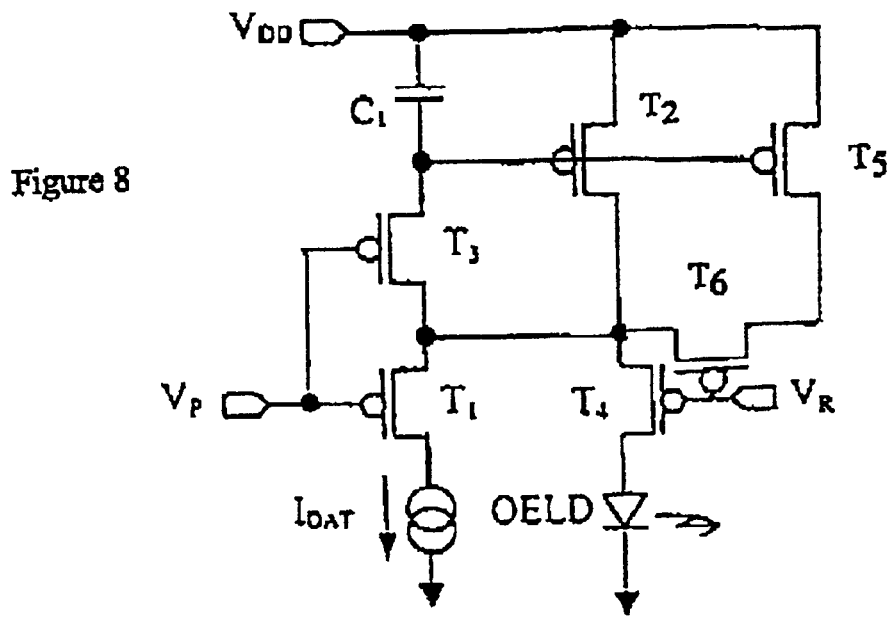
Figure 9:
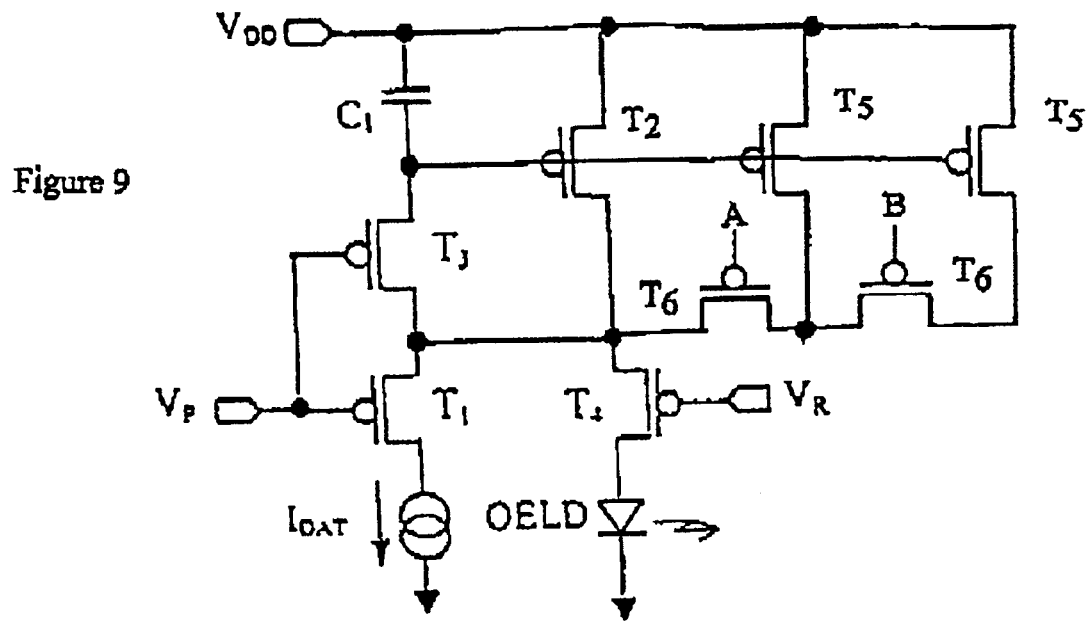
Figure 11:
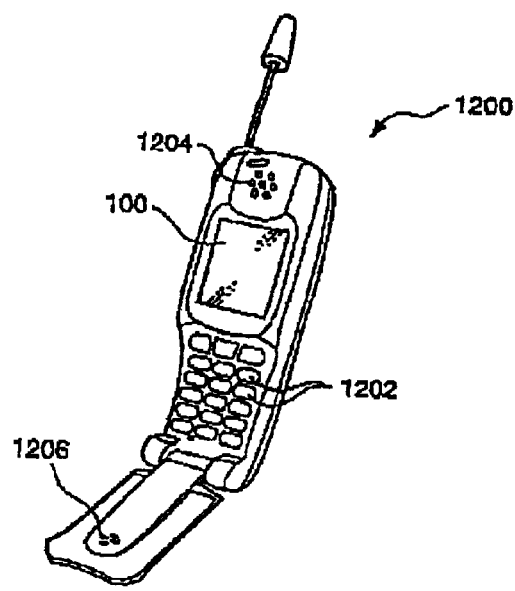
Figure 12:
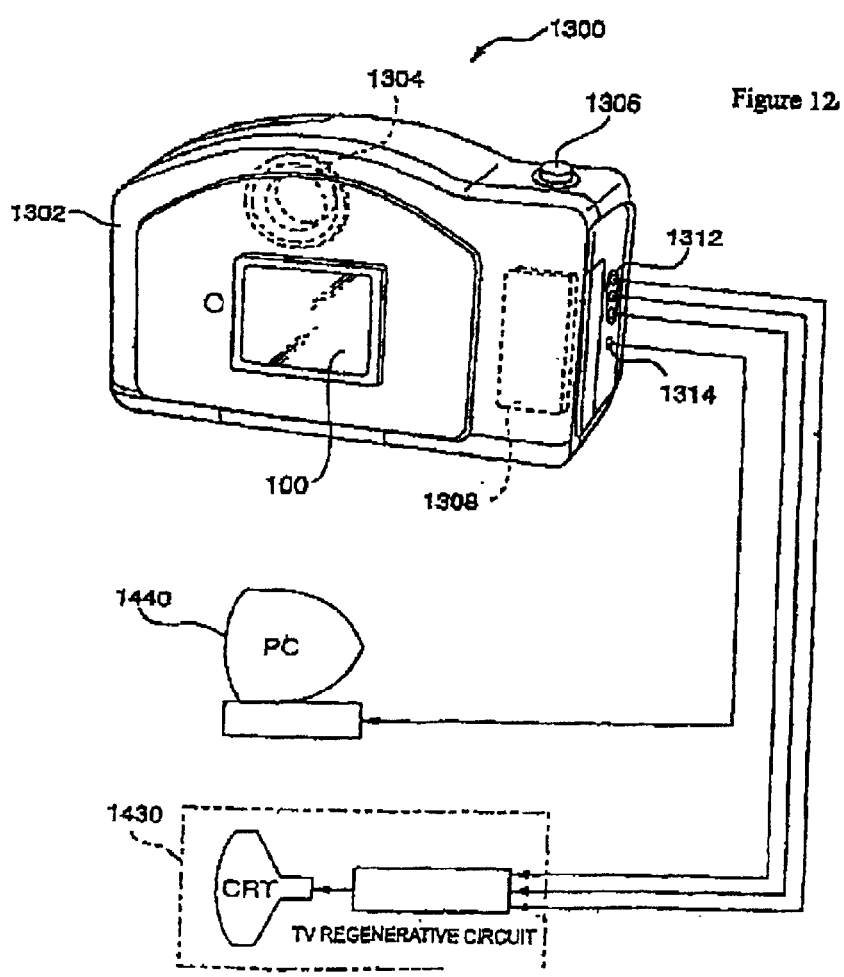
Figure 13:
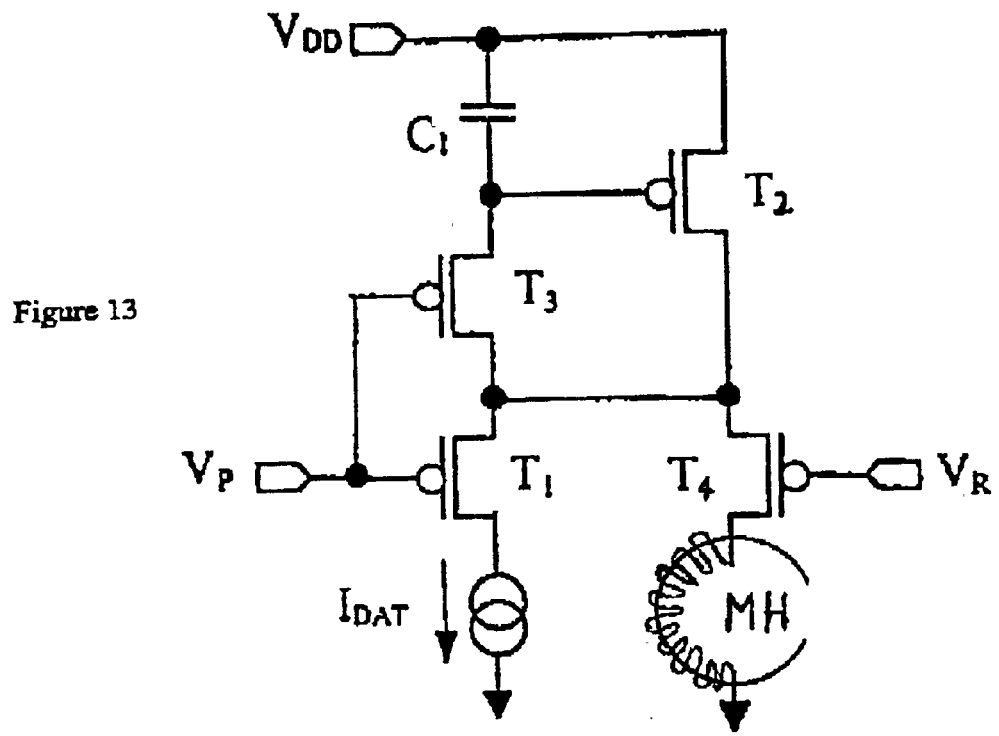
FIG. 13 illustrates the application of the driver circuit of the present invention to a magnetic RAM.
Figure 14:
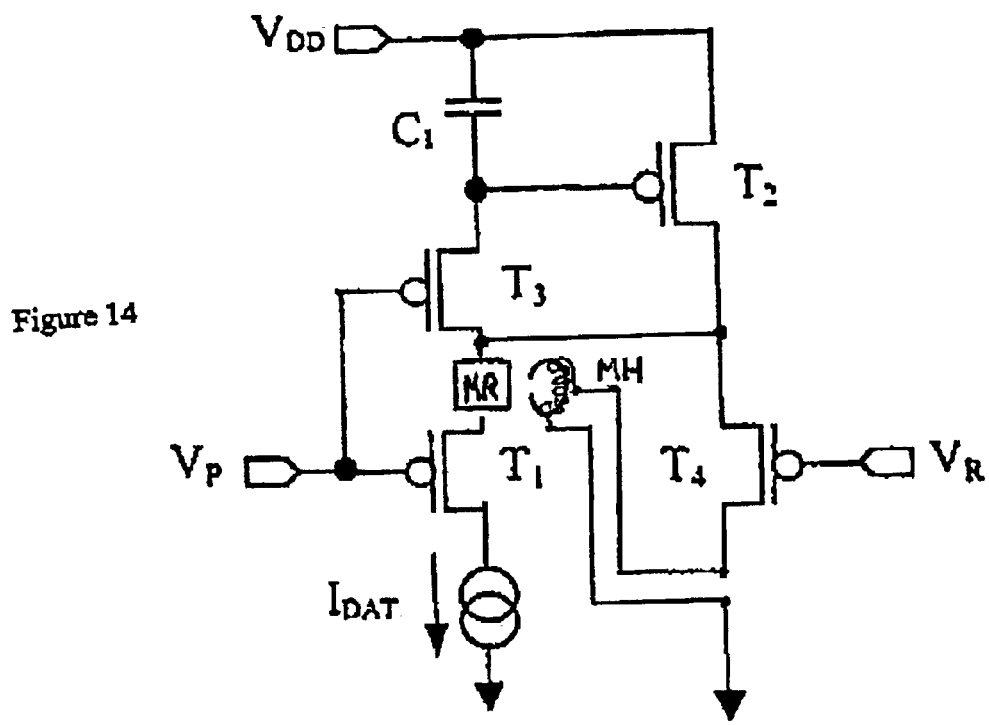
FIG. 14 illustrates the application of the driver circuit of the present invention to a magnetoresistive element.
Figure 17:
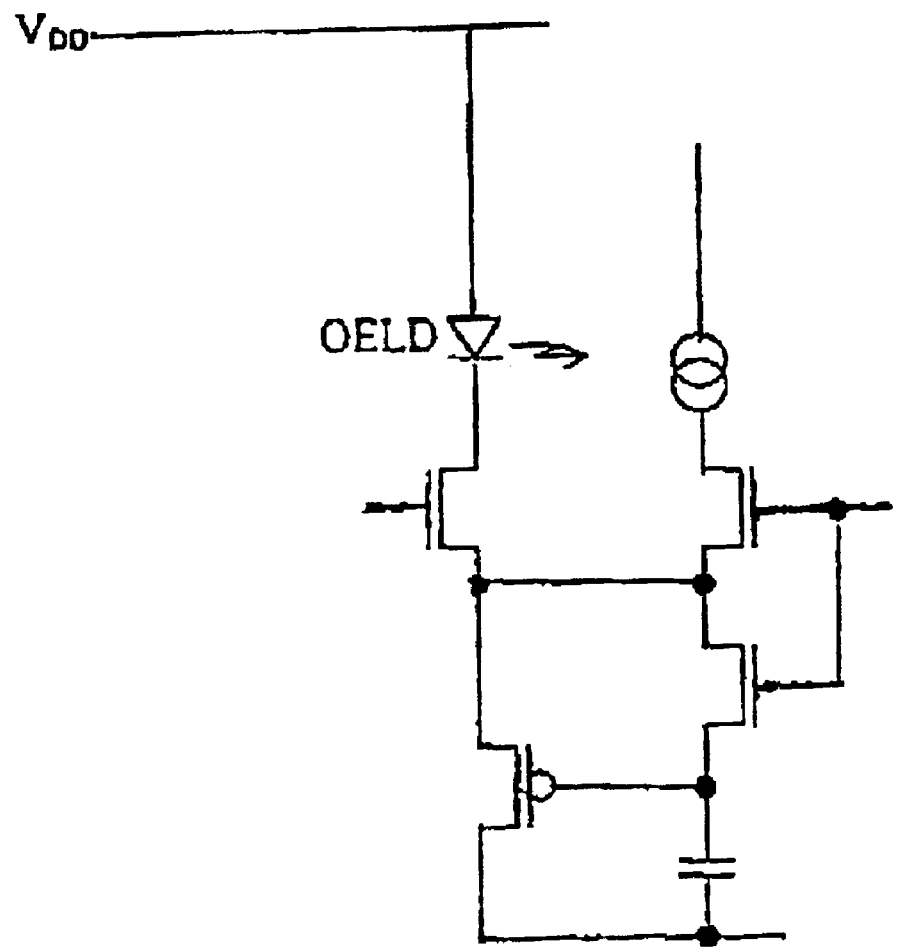

In the embodiments illustrated with reference to the above specific description the transistors have been shown as p-channel type transistors. This is not limiting of the invention. For example, FIG. 17 is a brief outline of an alternative implementation of the circuit of FIG. 4. In FIG. 17 n-channel transistors are used throughout the circuit, except for the drive transistor which is retained as a p-channel transistor.

It will be apparent to persons skilled in the art that other variations and modifications can be made to the arrangements described with respect to FIGS. 3 to 16 without departing from the scope of the invention.

What is claimed is:

1. A driver circuit to drive a pixel of an electroluminescent device, the pixel including an electroluminescent element, the circuit comprising:

a transistor of which a conducting state is set according to a data current that determines a current level of a driving current supplied to the electroluminescent element;

a first switching device connected so as to establish a first current path through which the data current flows during a programming stage, the data current flowing through the transistor and the first switching device to a data line during the programming stage; and a second switching device connected so as to establish a second current path through the transistor and the electroluminescent element during a reproduction stage, the first and second switching devices being controlled by respective control signals supplied from separate signal lines.

2. The driver circuit according to claim 1, further comprising a third switching device, the third switching device being connected to bias the transistor to act as a diode during the programming stage.

3. The driver circuit according to claim 2, wherein the third switching device connects the first switching device to the gate of the transistor.

4. The driver circuit according to claim 1, wherein the circuit is implemented with polysilicon thin film transistors.

5. An electroluminescent display device comprising the driver circuit according to claim 1.

6. An electronic apparatus incorporating an electroluminescent display device as claimed in claim 5.

7. The circuit according to claim 1, wherein the transistor is a p-channel thin film transistor.

8. A method of controlling a supply of a driving current to an electroluminescent element, the method comprising:

providing a first current path through which a data current that determines a current level of the driving current flows during a programming stage by using a first switching device connected so as to establish the first current path that allows the data current to flow through the first switching device to a data line; and providing a second current path during a reproduction stage by controlling a second switching device connected so as to establish the second current path, the second current path passing through the electroluminescent element, the first switching device and the second switching device being controlled by respective control signals supplied from separate signal lines.

9. A method of controlling a current supply to an electroluminescent element, the method comprising:

providing a first current path including a transistor during a programming stage; and providing a second current path including the transistor during a reproduction stage, the second current path passing through the electroluminescent element, providing a data current that determines a conduction state of the transistor, the data current flowing from a power-supply line to a data line through the first current path, supplying a driving current to the electroluminescent element, the driving current flowing through the second current path, and providing a current level of the driving current corresponding to the conduction state of the transistor.

10. A circuit comprising a current driven element, the circuit providing a first current path through which a data current, that determines a current level of a driving current supplied to the current driven element, flows through the first switching device to a data line by controlling a first switching means;

the circuit providing a second current path through which the driving current flows by controlling a second switching means, the driving current flows through the current driven element, and the first switching means and the second switching means being controlled by respective control signals supplied from separate signal lines.

11. The circuit according to claim 10, wherein the first and second switching means are n-channel thin film transistors.

12. The circuit according to claim 10, wherein the first current path and the second current path include a transistor.

13. An electro-optical device comprising a plurality of pixels, each of the plurality of pixels including a circuit that controls a driving current supplied to a current driven element, the circuit providing a first current path that excludes the current driven element by controlling a first switching device, and a data current that determines a current level of the driving current, the data current flowing through the first current path and the first switching device to a data line, the circuit further providing a second current path that includes the current driven element by controlling a second switching device, and the first and second switching devices being controlled by respective control signals supplied from separate signal lines.

14. An electronic apparatus including the electro-optical device according to claim 13.

15. A circuit comprising a current driven element, the circuit providing:

a first current path during a first period and a second current path during a second period, a data current that determines a conduction state of a transistor included in the circuit, the data current flowing through the first current path, a driving current of which a current level corresponds to the conduction state of the transistor, the driving current flowing through the second current path, the data current flowing to a current sink and a data line through the transistor, and the driving current flowing to the current driven element through the transistor.

16. A method for driving a circuit comprising a current driven element and a transistor that controls a current supplied to the current driven element, the method comprising:

determining a gate voltage of the transistor by flowing a data current from a voltage supply to a current sink through the transistor and a data line; and providing a driving current to the current driven element, the driving current corresponding to the gate voltage determined according to the data current.

17. The method according to claim 16, no current is the data current being supplied to the current driven element during the determining of the gate voltage of the transistor.

18. A driver circuit to drive a pixel of an electroluminescent element, the driver circuit comprising:

a transistor connected so as operatively control the current supplied to the electroluminescent element;

a first switching device connected so as to establish a first current path including the transistor during the programming stage;

a second switching device connected so as to establish a second current path including the transistor and the electroluminescent element during a reproduction stage; and a current sink, the first switching device being connected such that the first current path during the programming stage is connected through a data line to the current sink.

19. The driver circuit according to claim 18, the first and second switching devices being controlled by respective control signals supplied from separate signal lines.

20. An electroluminescent display device comprising the driver circuit according to claim 18.

21. The driver circuit according to claim 18, the transistor being a p-channel transistor.

22. The driver circuit as claimed in claim 18, the first and the second switching devices being formed of respective n-channel transistors.

* * * * *